(12) United States Patent
Barou et al.

(10) Patent No.: US 7,345,543 B2
(45) Date of Patent: Mar. 18, 2008

(54) FAST TRANSCONDUCTANCE AMPLIFIER

(75) Inventors: Michel Barou, Voreppe (FR); Ashraf Kessaissia, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 88 days.

(21) Appl. No.: 11/172,277

(22) Filed: Jun. 30, 2005

(65) Prior Publication Data
US 2006/0001491 A1    Jan. 5, 2006

(30) Foreign Application Priority Data
Jun. 30, 2004  (FR) .................................. 04 51364

(51) Int. Cl.
*H03F 3/45*   (2006.01)
(52) U.S. Cl. ........................ 330/257; 455/76
(58) Field of Classification Search ............... 330/257; 455/76
See application file for complete search history.

(56) References Cited

U.S. PATENT DOCUMENTS 5,185,582 A * 2/1993 Barbu ........................ 330/261
5,983,082 A * 11/1999 Hilbert ........................ 455/76
5,999,050 A   12/1999 Baltus
2001/0001232 A1  5/2001 Kung
2003/0206061 A1  11/2003 Yamamoto

OTHER PUBLICATIONS

French Search Report from French Patent Application No. 04/51364, filed Jun. 30, 2004
Elwan H. et al. "CMOS low-voltage class—AB operational transconductance amplifier"Electronics Letters, IEE Stevenage, GB, vol. 36, No. 17, Aug. 17, 2000, pp. 1439-1440, XP006015598 ISSN: 0013-5194.

* cited by examiner

*Primary Examiner*—Robert Pascal
*Assistant Examiner*—Hieu Nguyen
(74) *Attorney, Agent, or Firm*—Lisa K. Jorgenson; James H. Morris; Wolf, Greenfield & Sacks, P.C.

(57) ABSTRACT

An amplifier including an input stage having two inputs, each input being connected to the control terminals of first and second transistors, a current output of the first transistor being connected to a first terminal of a resistor and to a reference supply rail via a variable current source having a value capable of automatically varying according to the voltage applied between said amplifier inputs up to a limiting value, and a current output of the second transistor being connected to the reference supply rail via a fixed current source and to the second terminal of the resistor.

7 Claims, 2 Drawing Sheets

FAST TRANSCONDUCTANCE AMPLIFIER

BACKGROUND OF THE INVENTION

1. Field of the Invention

The present invention relates to the field of amplifiers. More specifically, the present invention relates to fast transconductance amplifiers.

2. Discussion of the Related Art

FIG. 1 is a schematic electric diagram illustrating an amplifier AMP intended to drive a capacitive load Cs, for example, the cathode of a cathode-ray tube. Generally, a resistor Rs is connected between the output of amplifier AMP and capacitor Cs.

Amplifier AMP is formed by the series-connection of an amplifier with a transconductance (G) OTA and of an amplifier-follower OP of gain unity (1). Amplifier OTA exhibits an output resistance Ro and an output capacitance Cc. The output of follower amplifier OP which forms the output of amplifier AMP is brought back into an input A of amplifier OTA via a reverse feedback resistor Rf. Input A receives an input signal via a resistor Re. Another input B of amplifier OTA is connected to a reference voltage source Vref on the order of 3 V. A voltage difference Vin is applied between the two inputs B and A via reverse feedback network Rf/Re.

Amplifier AMP provides an armature Q of capacitor Cs with a voltage variation ΔV. Variation ΔV must generally be provided with a determined slew rate Δt. For example, when load Cs is a cathode-ray screen, variation ΔV is on the order of 100 V and must occur with a relatively short time Δt of at most 10 ns. Variation ΔV on terminal Q is equal to the voltage variation at the output of amplifier OTA. To obtain a variation ΔV within a time Δt, the charge current of capacitor Cc, that is, the output current of amplifier OTA, varies from a transient or dynamic value $i_{OUT}=Cc(\Delta V/\Delta T)$. Assuming that the value of capacitor Cc is on the order of 1 pF, current $i_{OUT}$ must thus be equal to approximately 10 mA to obtain a variation ΔV of 100 V within a time Δt of 10 ns.

Two types of transconductance amplifiers exist. Class A amplifier, in which the quiescent current is at least equal to the transient current. Considering the preceding example, a quiescent current equal to 10 mA would then be necessary, which corresponds to a high static dissipation.

To reduce the power consumption, a class AB amplifier OTA is thus generally used, in which the common-mode current of the amplifier is small in the quiescent state and is automatically adjusted, on a variation, to the value of the transient or dynamic current.

FIG. 2 schematically illustrates a conventional embodiment of a known class AB transconductance amplifier. Amplifier OTA comprises a high-voltage stage comprising a current mirror 10 formed of two P-channel MOS transistors P1 and P2 having their sources connected to a same high supply rail Vdd, ranging between 160 and 220 V. Drain D1 of transistor P1 is connected to common gate G of transistors P1 and P2. Drain D2 of transistor P2 forms output terminal OUT of amplifier OTA. Each terminal D1 and D2 is connected to a respective output terminal C1 and C2 of an input stage 20 of amplifier OTA.

Stage 20 generally is a low-voltage stage and a cascode assembly 30 is interposed between mirror 10 and input stage 20. Cascode assembly 30 is formed of two identical N-channel MOS transistors N1 and N2 having their interconnected gates connected to the same low voltage Vcc, generally on the order of from 5 to 12 V. The drain of transistor N1 is connected to terminal D1 and the drain of transistor N2 is connected to terminal D2. The source of transistor N1 is connected to terminal C1 and the source of transistor N2 is connected to terminal C2. The structure of input stage 20 is the following.

Inputs A and B of amplifier OTA are connected to the bases of respective identical follower-assembled NPN-type bipolar transistors T1 and T2. The collectors of transistors T1 and T2 are connected to low power supply Vcc. The emitters of transistors T1 and T2 are connected to respective nodes A' and B'.

Each of nodes A' and B' is connected to the base of a respective NPN-type bipolar transistor T3 and T4. Transistors T3 and T4 are identical. The collector of transistor T3 forms terminal C1. The collector of transistor T4 forms terminal C2. A resistor (R) 22 is connected between emitters E1 and E2 of transistors T3 and T4. The respective emitters E1 and E2 are connected to the output terminal of a respective variable common-mode current source 40 and 50. Sources 40 and 50 have identical structures. Source 40 comprises, between node A' and a reference supply rail or ground GND (0 V), a voltage source PS1, and a current source CS1. The junction point of source PS1 and CS1 is connected to the base of a bipolar PNP-type transistor T6 having its emitter connected to terminal E1 and having its collector connected to ground GND. Symmetrically, source 50 includes a voltage source PS2 and a current source CS2 series-connected between node B' and reference rail GND. Source 50 also comprises a bipolar PNP-type transistor T7 having its base connected to the junction point of source PS2 and CS2 and having its emitter connected to node E2. Current sources CS1 and CS2 are identical. Voltage sources PS1 and PS2 are identical. Transistors T6 and T7 are identical.

The operation of the transconductance amplifier of FIG. 2 is the following. Upon occurrence of a potential difference Vin between inputs B and A of amplifier OTA, difference Vin is transmitted between nodes A' and B' and thus between nodes E1 and E2. Potential difference Vin between nodes E1 and E2 of resistor 22 causes the flowing of a current i, with the positive convention of the current directed from E1 to E2. The current transmitted by transistor N1 of cascode assembly 30 on terminal D1 then is I0+i, where I0 is the common-mode current set by source 40. Current I0+i is copied by mirror 10 at node D2. ΔAt the level of terminal E2, the current coming from transistor T4, and thus coming out of node D2, must be equal to 10−i, where I0 is the common-mode current set by source 50. Charge current $i_{out}$ of capacitor Cc is thus equal to twice current i flowing through resistor 22. The various circuit parameters are thus set according to relation $i_{out}=2i=Vin/2R=Cc\,(\Delta V/\Delta t)$.

Value I0 of the common-mode current set by sources 40 and/or 50 automatically adapts to the value of current i. In the absence of a variation of Vin, this current is minimum, set by the characteristics of sources PS1, PS2, CS1, and CS2 of sources 40 and 50. Upon occurrence of a variation of Vin, the potential variation at nodes A' and B' automatically modulates the control of transistors T6 and T7 which provide the adapted current I0 for I0±i to be non-zero. Input transistors T1 and T2 are not indispensable to the circuit operation and signal Vin may be applied directly between nodes A' and B'. However, transistors T1 and T2 enable isolating input signal Vin from identical voltage sources PS1 and PS2 connected to nodes A' and B'.

This ability of the circuit to draw any value of common-mode current I0 necessary to the proper circuit operation causes malfunctions. For example, in the control cycle of a cathode-ray screen, it is passed through so-called blanking phases during which terminal B is maintained at a reference voltage Vref on the order of 3 volts and terminal A is directly connected to ground GND at 0 V. The 3-volt potential difference which then appears across resistor 22 with a 100-Ω value R translates as a dynamic current i on the order of 30 mA. The output current then is very high, on the order of 60 mA. The value of common-mode current 10 is automatically adjusted to be at least equal to 30 mA.

Then, transistors T6 and T7 draw the high common-mode current from the power supply, which increases the circuit power consumption. Further, in one of branches D1-C1-E1 and D2-C2-E2, for example, in branch D1-C1-E1, flows a high current I0±i on the order of 60 mA. As high a current may damage the elements of cascode assembly 30 and/or of current mirror 10, or even bipolar transistor T3.

Further, the blanking phase periodically appears on control of the screen, periodically increasing the circuit power consumption. This periodic character increases the fatigue—the wearing—and thus the damaging risks of the elements of the circuit abruptly submitted to a high current.

Moreover, the abrupt voltage variation ΔV linked to the abrupt variation of the output current to a very high value is excessive, and unnecessary.

The only known way of attempting to overcome these disadvantages is to return to a class A amplifier circuit. In such an amplifier, as compared to the class AB amplifier of FIG. 2, identical variable current sources 40 and 50 are replaced with fixed current sources. The dynamic current peaks are then impossible. This is however obtained at the cost of a high continuous power consumption.

SUMMARY OF THE INVENTION

The present invention accordingly aims at providing a transconductance amplifier which overcomes the previously-described disadvantages.

In particular, the present invention aims at providing an amplifier having a common-mode current that can automatically adapt to the value of a transient current.

The present invention also aims at providing such an amplifier having a limited common-mode current value.

To achieve these and other objects, the present invention provides a transconductance amplifier comprising an input stage comprising two input terminals, each input terminal being connected to the control terminals of first and second respective input transistors, a current output terminal of the first transistor being connected, on the one hand, to a first terminal of a respective resistor and, on the other hand, to a reference supply rail via a variable current source having a value capable of automatically varying according to the voltage applied between the amplifier inputs up to a limiting value, and a current output terminal of the second transistor being connected, on the one hand, to the reference supply rail via a fixed current source and, on the other hand, to a second terminal of the resistor connected to the current output terminal of the first transistor.

According to an embodiment of the present invention, the variable current source comprises:

a third transistor connected between the emitter of the first transistor and the ground;

a resistor and a capacitor, series-connected between the low supply rail and the control terminal of the third transistor, the midpoint of such a series connection being connected to the current input terminal of the first transistor;

a fourth transistor connected between a fixed current source and the ground, the fixed current source being connected between the low supply rail and the current input terminal of the fourth transistor, the control terminal of the fourth transistor being connected to the current input terminal of the fourth transistor and, via a resistor, to the control terminal of the third transistor.

According to an embodiment of the present invention, a current input terminal of the second transistor is connected to a respective output terminal of the second current mirror, a current output terminal unconnected to a common control terminal of the second mirror forming the output terminal of the amplifier.

According to an embodiment of the present invention, a cascode assembly is interposed between the current input terminals of the two second transistors and the current output terminals of the second mirror.

According to an embodiment of the present invention, the first, second, third, and fourth transistors are identical NPN-type bipolar transistors.

According to an embodiment of the present invention, the amplifier comprises an input stage formed of a transconductance amplifier.

According to an embodiment of the present invention, the amplifier comprises an output stage formed of a unity gain amplifier.

According to an embodiment of the present invention, the amplifier drives the cathode of a cathode-ray screen.

The foregoing and other objects, features, and advantages of the present invention will be discussed in detail in the following non-limiting description of specific embodiments in connection with the accompanying drawings.

DETAILED DESCRIPTION

Figure 1:
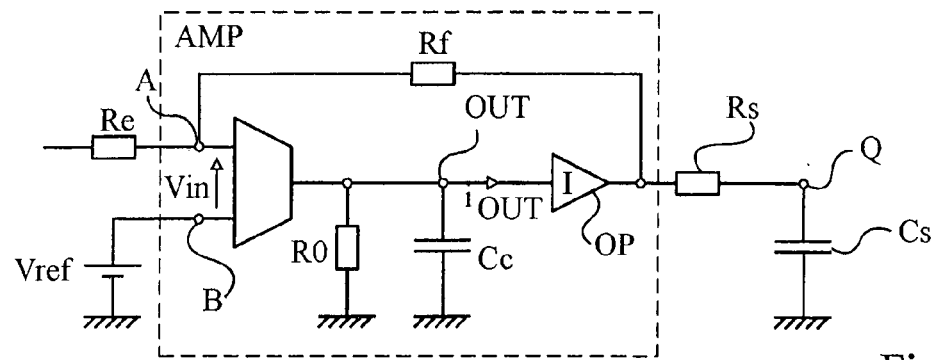
FIG. 1 illustrates the general structure of a fast amplifier associated with a capacitive load.

For clarity, the same elements have been designated with the same reference numerals in the different drawings and, further, as usual, only those elements that are necessary to the understanding of the present invention have been shown. Thus, the detailed structure of a unity gain amplifier, as well as the structure of a full capacitive load such as a cathode-ray screen, have not been shown in FIG. 1.

Figure 2:
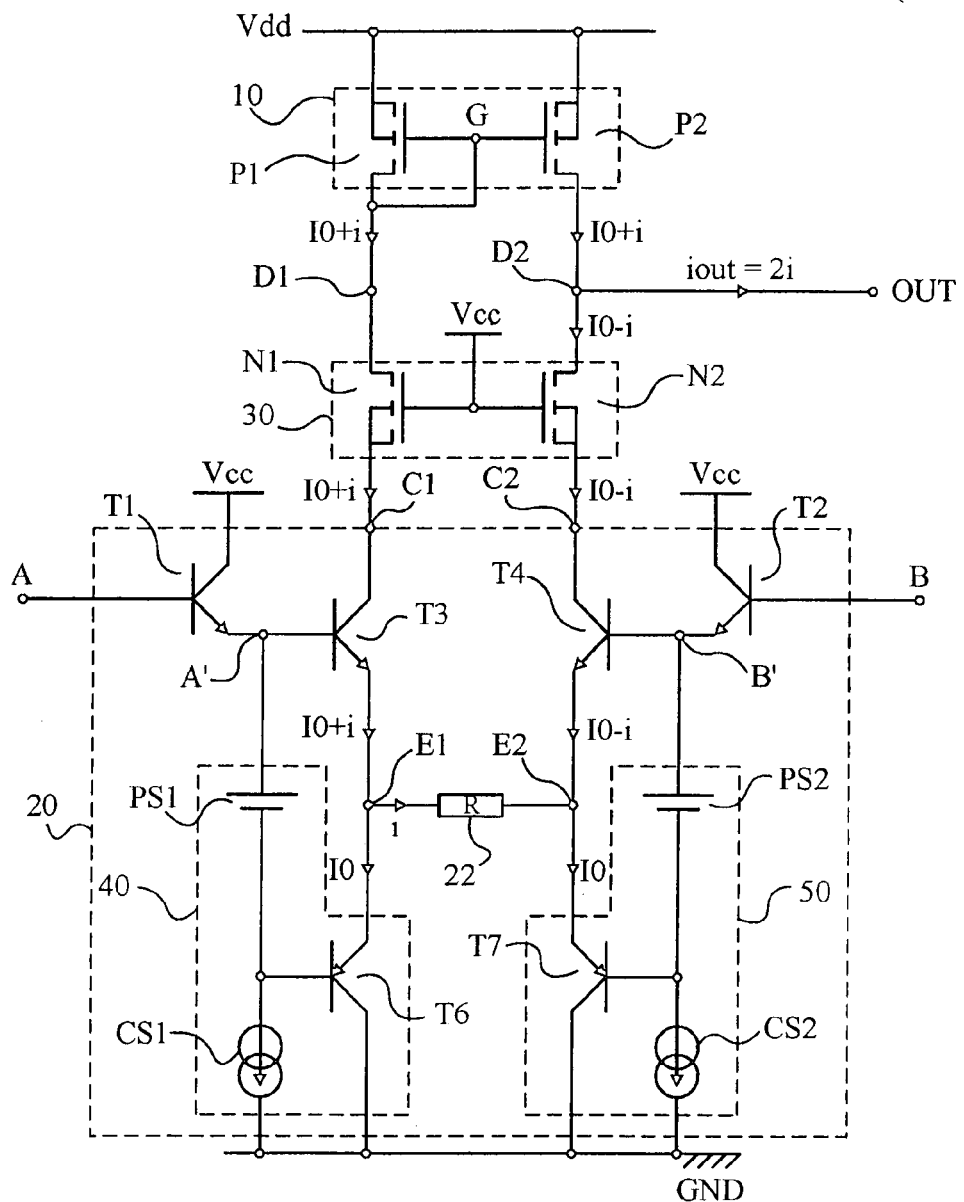
FIG. 2 schematically illustrates a known transconductance amplifier.
Figure 3:
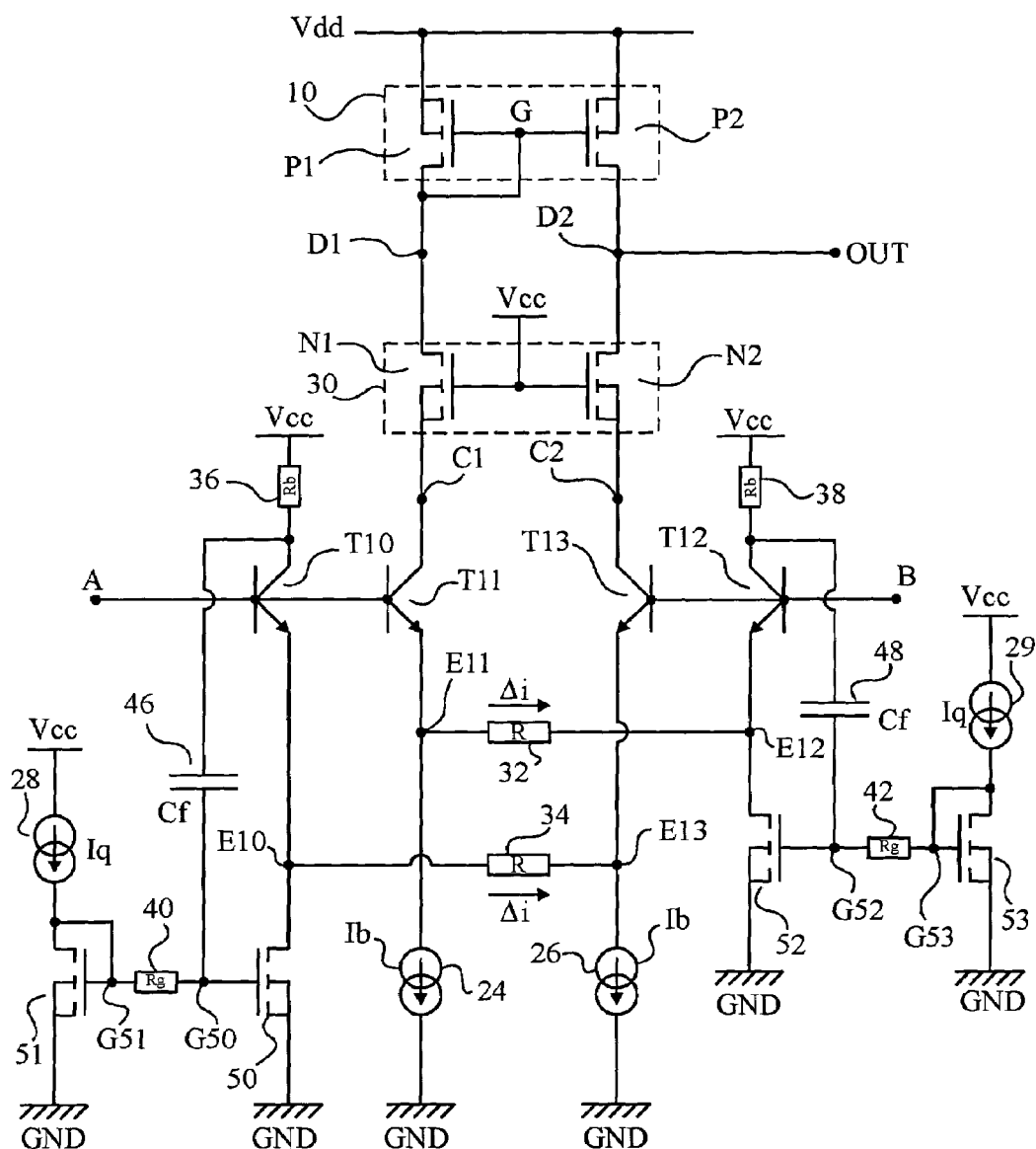
FIG. 3 schematically illustrates a transconductance amplifier according to an embodiment of the present invention.

FIG. 3 illustrates a transconductance amplifier according to an embodiment of the present invention. Such an amplifier comprises a current mirror 10 and a cascode assembly 30 similar to those described in relation with FIG. 2. Accordingly, only the input stage of the amplifier of FIG. 3 will be described hereafter.

Terminal A is connected to the base terminals of two identical NPN-type bipolar transistors T10 and T11. The collector of transistor T11 forms terminal C1 of the input stage. Emitter E11 of transistor T11 is connected to a reference supply or ground rail GND via a fixed current source (Ib) 24.

Symmetrically, terminal B is connected to the base terminals of two NPN-type identical bipolar transistors T12 and T13. Transistors T12 and T13 are identical to transistors T10 and T11. The collector of transistor T13 forms terminal C2 of the input stage. Emitter E13 of transistor T13 is grounded via a fixed current source (Ib) 26 identical to source 24.

A first resistor (R) 32 is connected between emitters E11 and E12. A second resistor (R) 34 of same value R as resistor 32 is connected between emitters E10 and E13.

The collector of transistor T10 is connected to a low supply rail Vcc via a resistor (RL) 36. Similarly, the collector of transistor T12 is connected to low supply terminal Vcc via a resistor (RL) 38 of same value RL as resistor 36. The collector of transistor T10 or T12 is also connected to an armature of a respective capacitor (Cf) 46 or 48. Capacitances Cf of capacitors 46 and 48 are equal.

On the side of transistor T10, two identical N-channel MOS transistors 50 and 51 form a current mirror. A first branch of the mirror is formed by the series connection between low supply Vcc and ground GND of a fixed current source (Iq) 28 and of a transistor 51. The drain of transistor 51 is connected to its gate G51. Gates G51 and G50 of transistors 51 and 50 are interconnected via a resistor (Rg) 40. Gate G50 is also connected to the armature of capacitor 46 unconnected to the collector of transistor T10. Transistor 50 is interposed between emitter E11 of transistor T10 and ground GND.

Symmetrically, a current mirror is interposed between terminal E12 and supply Vcc. The mirror is formed of two identical N-channel MOS transistors 52 and 53 identical to transistors 50 and 51. Gates G52 and G53 of transistors 52 and 53 are connected via a resistor (Rg) 42 identical to resistor 40. Gate G52 is connected to the armature of capacitor 48 unconnected to the collector of transistor T12. Transistor 52 is interposed between emitter E12 of transistor T12 and ground GND. Gate G53 of transistor 53 is connected to the drain of transistor 53 which is connected to low supply Vcc via a fixed current source (Iq) 29. Fixed value Iq of the current provided by source 29 is equal to that provided by source 28.

Each of current mirrors 50-40-51-28 and 52-42-53-29 associated with a resistor RL 36 or 38 and with a capacitor Cf 46 or 48 forms a variable current source having a value likely to vary up to a limiting value set by values RG and Cf.

In the quiescent state, that is, in the absence of a potential difference between inputs A and B, and thus between emitters E10 and E13 and between emitters E11 and E12, the voltage drop across resistors R 32 and 34 is zero. The current flowing through each resistor R 32 and 34 is zero. Current mirror 10 then copies fixed current Ib provided by sources 24 and 26 and the output current is zero. In the absence of a variation of the potentials, capacitors Cf behave as off switches. The biasing of gates G50, G51, and G52, G53 of the two pairs of transistors 50, 51 and 52, 53 is then fixed, determined by current Iq provided by source 28 or 29 and by resistor Rg. Each mirror copies current Iq provided by source 28 or 29. A static power consumption linked to the flowing, on the one hand of a current Ib in each branch P1, N1, T11, 24 and P2, N2, T13, 26, and on the other hand of a current Iq in each source 50, 40, 51, 28, 36, T10, and 52, 42, 53, 29, 38, T12 thus appears. This static power consumption is relatively small, on the order of that of a standard class AB amplifier.

In dynamic state, a potential difference Vin appears between inputs A and B and thus between emitters E11 and E12 and between emitters E10 and E13. On the one hand, a same voltage drop then appears across resistors 32 and 34 of same value R. A dynamic current Δi of the same intensity flows in each of resistors R. On the other hand, each network comprising Cf and Rg causes a current absorption or generation. Indeed, a current equal to the sum or to the difference of the current flowing in current mirror 50, 51, or 52, 53 and of dynamic current Δi flows in each resistor RL 36 or 38. This causes a variation, a decrease or an increase, in the voltage at the level of the collector of transistor T10 or T12. This voltage variation is transmitted by capacitor Cf 46 or 48 on gates G50 and G51 or G52 and G53 of transistors 50 and 51 or 52 and 53, causing a decrease or an increase in the gate-source potential difference of transistor 50 or 52. Thus, the current absorbed by transistor 50 or 52 correspondingly decreases or increases.

However, according to the present invention, the current absorption capacity at the level of transistors 50 and 52—or the voltage variation capacity at the level of the collector of bipolar transistors T10 and T12—is limited by the network formed by resistors 36, 40 and 38, 42 and capacitors 46 and 48. The symmetrical parameters of these networks are selected to enable letting through a sufficient output current to control the load connected at the output of amplifier AMP of FIG. 1 to limit any excessive variation.

The present invention advantageously aims at overcoming the disadvantages of the known circuit previously described in relation with FIG. 2.

In particular, in the quiescent state, the fast transconductance amplifier according to the present invention exhibits a reduced static power consumption, like a class AB amplifier. This power consumption is reduced to low currents on the order of one milliampere of current sources 24, 26, 28, and 29.

Further, in dynamic state, the fast transconductance amplifier according to the present invention automatically adjusts the value of a current absorbed or generated to the value of the dynamic current, like a conventional class AB amplifier, while limiting, like for a known class A amplifier, the absorbed or generated value, and thus the dynamic current.

The present invention thus advantageously enables avoiding high-current excursions. This enables reducing risks of damaging elements of known amplifiers. This also advantageously enables limiting the power consumption in dynamic state. Further, this result is obtained without significantly increasing the static power consumption, conversely to known class A amplifiers.

According to an embodiment of the present invention, the features of the various components of the amplifier of FIG. 3 are the following:

Current source 24 and 26: Ib=0.8 mA;
Resistors 32 and 34: R=150 Ω;
Resistors 36 and 38: RL=750 Ω;
Capacitors 46 and 48: Cf=1 pf;
Resistors 40 and 42: Rg=50 kΩ;
Current sources 28 and 29: Iq=1 mA.

Of course, the present invention is likely to have various alterations, modifications, and improvements which will readily occur to those skilled in the art. In particular, it should be clear to those skilled in the art that in the embodiment of FIG. 3, the various transistors have been selected as being arbitrarily of bipolar or MOS type and that any bipolar transistor may be replaced with a MOS transistor and conversely. It will however be ascertained in such a modification to respect the circuit symmetry and replace in a considered branch all the transistors having an identical function with same transistor types. For example, bipolar transistors T10, T11, T12, and T13 will preferably be replaced with MOS transistors.

Further, it should be clear to those skilled in the art that cascode assembly 30 may advantageously be avoided by replacing transistors T11 and T13 with transistors capable of withstanding a high voltage. Generally, it will be within the abilities of those skilled in the art to select the features of the various components of the circuit according to the present invention according to the desired performances.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A transconductance amplifier comprising an input stage comprising two input terminals, wherein each input terminal is connected to a first control terminal of a first transistor, and a second control terminal of a second transistor;
   a current output terminal of the first transistor being connected, on the one hand, to a first terminal of a respective resistor and, on the other hand, to a reference supply rail via a variable current source having a value capable of automatically varying according to a voltage applied between the input terminals; up to a limiting value; and
   a current output terminal of the second transistor being connected, on the one hand, to the reference supply rail via a fixed current source and, on the other hand, to a second terminal of the respective resistor connected to the current output terminal of the first transistor,
   wherein the variable current source comprises:
   a third transistor connected between an emitter of the first transistor and ground;
   a resistor and a capacitor, series-connected between a low supply rail and a control terminal of the third transistor;
   wherein a midpoint of the series connection being connected to the current input terminal of the first transistor, and;
   a fourth transistor connected between a fixed current source and ground, the fixed current source being connected between the low supply rail and a current input terminal of the fourth transistor;
   wherein a control terminal of the fourth transistor being connected to the current input terminal of the fourth transistor and, via a resistor, to a control terminal of the third transistor.

2. The amplifier of claim 1, wherein a current input terminal of the second transistor is connected to a respective output terminal of a first current mirror,
   wherein a current output terminal is unconnected to a common control terminal of the first current mirror forming the output terminal of the amplifier.

3. The amplifier of claim 2, wherein a cascode assembly is interposed between the current input terminals of the two second transistors and the current output terminals of the first current mirror.

4. The amplifier of claim 1, wherein the first, second, third, and fourth transistors are identical NPN-type bipolar transistors.

5. A power amplifier, comprising an input stage formed of the transconductance amplifier of claim 1.

6. The amplifier of claim 5, wherein the amplifier comprises an output stage formed of a unity gain amplifier.

7. The amplifier of claim 6, driving a cathode of a cathode-ray screen.

* * * * *

UNITED STATES PATENT AND TRADEMARK OFFICE
CERTIFICATE OF CORRECTION

PATENT NO.       : 7,345,543 B2  Page 1 of 1
APPLICATION NO.  : 11/172277
DATED            : March 18, 2008
INVENTOR(S)      : Michel Barou et al.

It is certified that error appears in the above-identified patent and that said Letters Patent is hereby corrected as shown below:

Col. 3, line 8, should read:
--of 60 mA. The value of common-mode current 10 is--

Signed and Sealed this

Seventeenth Day of June, 2008

JON W. DUDAS
*Director of the United States Patent and Trademark Office*